United States Patent [19]
Van Hout et al.

[11] Patent Number: 5,680,468
[45] Date of Patent: Oct. 21, 1997

[54] METHODS OF AND SYSTEMS FOR SPEAKER EQUALIZATION IN AUTOMOTIVE VEHICLES HAVING CONVERTIBLE TOPS

[75] Inventors: James E. Van Hout, Auburn Hills; Jack G. Mather, Walled Lake; David J. Madaj, Ann Arbor, all of Mich.

[73] Assignee: Chrysler Corporation, Auburn Hills, Mich.

[21] Appl. No.: 345,667

[22] Filed: Feb. 21, 1995

[51] Int. Cl.⁶ ............................................. H04B 1/00
[52] U.S. Cl. ..................... 381/86; 381/103; 381/57; 455/267
[58] Field of Search ........................ 381/86, 98, 103, 381/101, 104, 61, 57, 71; 455/345, 297, 267, 268

[56] References Cited

U.S. PATENT DOCUMENTS

| | | |
|---|---|---|
| 4,340,780 | 7/1982 | Odlen . |
| 4,641,344 | 2/1987 | Kasai et al. . |
| 4,903,307 | 2/1990 | Ozawa et al. . |
| 4,944,018 | 7/1990 | Bose ........................................ 381/86 |
| 5,133,017 | 7/1992 | Cain ........................................ 381/71 |
| 5,204,971 | 4/1993 | Takahaski et al. . |
| 5,208,483 | 5/1993 | Reneau . |
| 5,438,689 | 8/1995 | Kluth ...................................... 455/267 |

FOREIGN PATENT DOCUMENTS

| | | |
|---|---|---|
| 3910724 A1 | 10/1989 | Germany . |
| 3235734 | 10/1991 | Japan ...................................... 381/86 |

OTHER PUBLICATIONS

Patent Abstracts of Japan; vol. 13, No. 34 (E-708), 25 Jan. 1989 & JP-A-63 234634 (NEC), 29 Sep. 1988, *abstract*.
European Search Report.

*Primary Examiner*—Minsun Oh
*Attorney, Agent, or Firm*—Roland A. Fuller, III

[57] ABSTRACT

Automobiles having convertible tops and audio systems are provided with a first audio equalization mode for closed car conditions and a second audio equalization mode for open car conditions. The appropriate audio equalization mode is selected automatically upon raising or lowering the convertible top. In order to minimize inadvertent switching of modes, a timer is included in the system to delay switching from one mode to the other. The timer times a period of about three seconds.

8 Claims, 6 Drawing Sheets

METHODS OF AND SYSTEMS FOR SPEAKER EQUALIZATION IN AUTOMOTIVE VEHICLES HAVING CONVERTIBLE TOPS

FIELD OF THE INVENTION

The present invention relates to methods of and systems for speaker equalization in vehicles. More particularly, the present invention is directed to adaptive speaker equalization in vehicles having powered lift convertible tops.

BACKGROUND OF THE INVENTION

Audio system equalization involves setting bass and treble tone controls and fade and balance controls to provide sound characteristics according to the preference of the listener. In automotive vehicles, environmental factors such as road, wind and engine noise effect substantially the desired equalization settings; however, these effects are predictable and different equalization settings can be pre-programmed into the audio system of the vehicle. Selectable preset equalization is currently available with both a manufacturer preset and/or customer definable equalization settings. With these systems, the listener pushes a button on a control module to change equalization. In some vehicles, automatic equalization is available wherein inputs from sensors or system computers vary equalization according to environmental conditions.

In convertible automobiles, there is an abrupt change in the acoustical environment when the convertible top is opened. The equalization selected for a closed vehicle is seldom suitable for an open vehicle and vice-versa.

While the prior art provides systems which sense various environmental conditions and adjust equalization accordingly, the prior art does not include an arrangement for making a fundamental adjustment to equalization upon raising or lowering the convertible.

SUMMARY OF THE INVENTION

It is a feature of the present invention to provide an arrangement for adjusting equalization in audio systems upon raising or lowering the convertible top of an automobile in which the systems are installed.

The present method and apparatus is directed to an arrangement for adjusting equalization of audio system sound characteristics in automotive vehicles having convertible tops. According to the invention, this is accomplished by having a system with a preselected up equalization mode utilized when the convertible top is raised and a preselected down equalization mode utilized when the convertible top is lowered. The audio system is connected to the same switch which operates the convertible top. When the switch is pressed to raise the audio top, a timing circuit is activated, which timing circuit, after expiration of a selected timing interval, operates a switching circuit which switches the equalization from a "top up" equalization mode in which the automobile is closed with a convertible top to the "top down" equalization mode in which the automobile is open. If the convertible top is down and the convertible top switch is pushed to raise the convertible top, the switching circuit switches the audio system equalization from the "top down" equalization mode to the "top up" equalization mode after a selected time delay. The selected time delay minimizes the chances of false inputs due to inadvertent operation of the convertible top switch.

BRIEF DESCRIPTION OF THE DRAWINGS

Various other features and attendant advantages of the present invention will be more fully appreciated as the same becomes better understood when considered in conjunction with the accompanying drawings, in which like reference characters designate the same or similar parts throughout the several views, and wherein.

DETAILED DESCRIPTION

Figure 1:
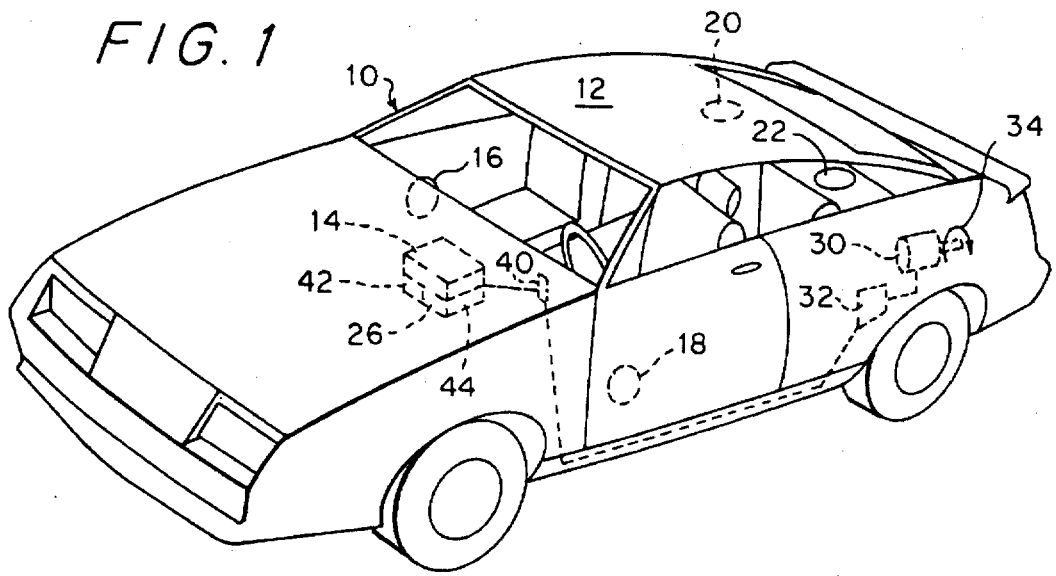
FIG. 1 is a perspective view of an automotive vehicle equipped with the system of the present invention, the vehicle having a raised convertible top

Referring now to FIG. 1, there is shown an automobile 10 with a convertible top 12. The automobile 10 is equipped with an audio system comprised of a radio, tape deck and perhaps CD player 14 connected to four speakers 16, 18, 20 and 22 through an equalization circuit 26 integral with the radio 14. In accordance with well known principles, the equalization circuit 26 has controls for setting bass and treble tones as well as fade and balance with respect to the speakers 16–22.

Figure 2:
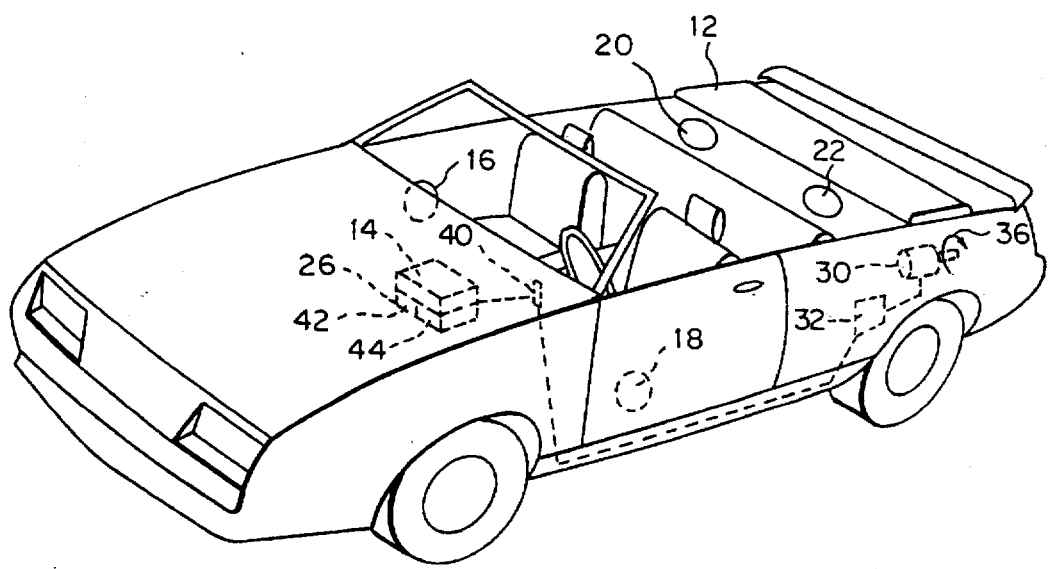
FIG. 2 is a view similar to FIG. 1 with the vehicle having a lower convertible top.

Referring now to FIG. 2, the convertible top 12 is raised and lowered by an electric motor 30 which is controlled by a controller 32 which causes the motor to rotate in a first direction 34 to lower the convertible top 12 and in a second direction 36 to raise the convertible top. The controller 32 is operated by a switch 40 on the dash board of the automobile 10 which can, for example, be a conventional rocker switch.

The rocker switch 40 is a three-position switch having a first position in which the convertible top 12 is lowered when the bottom of the switch is pushed, a second position in which the convertible top is raised when the top of the switch is pushed and a third "off" position to which the switch is mechanically biased. It is emphasized that the arrangement for raising the lowering the convertible top 12 is conventional. As long as the rocker switch 40 is pressed, the motor 30 will continue to rotate and the top will continue to lower or raise. If the rocker switch is released, the top 12 will stop lowering or raising. If the automobile 10 has a controller 32 equipped with limit switches (not shown), when the convertible top 12 is completely lowered or completely raised, the limit switches are tripped which interrupt power to the motor 30 causing the motor to stop. In many convertible top arrangements, limit switches are not used. The motor 30 simply continues to run as long as the operator keeps his or her finger on the pushbutton 51 or 52.

Figure 3:
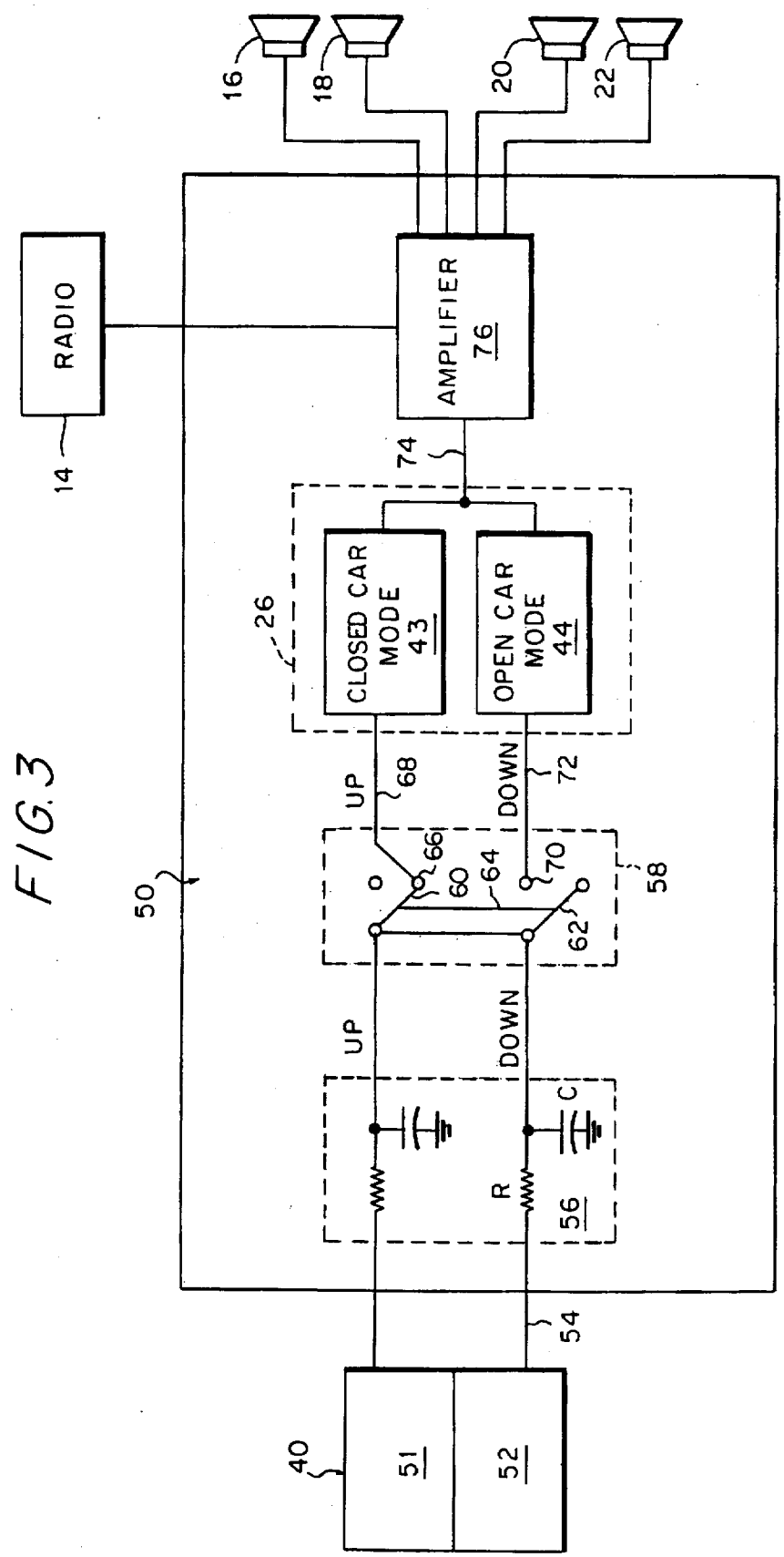
FIG. 3 is a diagram of a first embodiment of an equalization system in accordance with the present invention showing the system in a top up mode.
Figure 4:
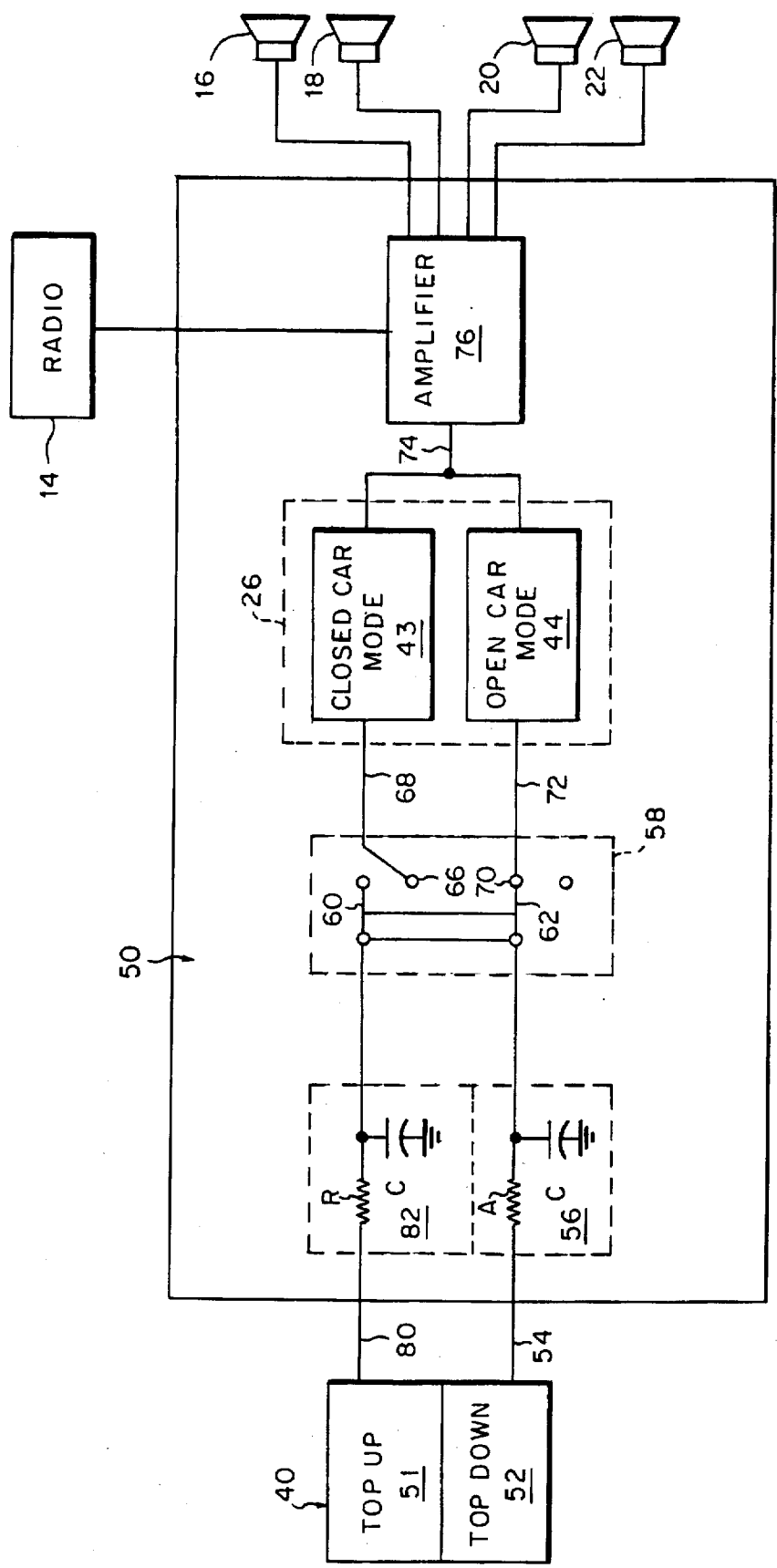
FIG. 4 is a diagram the first embodiment of the equalization system showing the system in a top down mode.

Referring now to FIGS. 3 and 4, there is shown a first embodiment of a system 50 for practicing the principles of the instant invention. In accordance with the present invention, when the top 12 is raised, the equalizer 26 is in a closed car mode, schematically illustrated by the box 43, and when the top 12 is lowered, the equalizer is set in an open car mode schematically illustrated by the box 44. In FIG. 3, the equalizer 26 is in the closed car mode 43 and, in FIG. 4, the system is in the open car mode 44. The button 40 has a first pushbutton portion 51 which is pressed to raise the convertible top and a second pushbutton portion 52 which is pressed to lower the top. Assuming that the automobile is closed, the equalizer 26 will be in the closed car mode 43 of FIG. 3. When it is desired to open the car by lowering the convertible top 12, the pushbutton portion 52 is pressed which switches the equalizer 26 from the closed car mode 43 to the open car mode 44 as is seen in FIG. 4.

The pushbutton portion 52 of the rocker switch 40 is connected by a line 54 through a first RC timing circuit 56 to a relay 58. The RC timing circuit 56 is set to time an interval in the range of 2–10 seconds and, preferably, about three seconds. Upon expiration of the preselected time interval, the capacitor is changed sufficiently to cause the relay 58 to switch contacts 60 and 62 from the FIG. 3 to the FIG. 4 position and thereby switch the equalizer 26 from the closed car mode of FIG. 3 to the open car mode of FIG. 4.

As is seen in FIG. 3, the contact arms 60 and 62 of the relay 58 connected by a rigid link 64. A pin 66 is connected by a line 68 to the equalizer 26 for selecting the closed car mode 43 and a pin 70 is connected by a line 72 to the equalizer 26 to select the open car mode 44. The closed and open car modes 43 and 44 are connected via line 74 to an amplifier 76 which is part of the radio 14. The amplifier 76 drives the speakers 16–22, in accordance with conventional practices.

When the pushbutton portion 52 is pressed to lower the convertible top 12, the relay 58 switches from the FIG. 3 to the FIG. 4 position opening contact with pin 66 and closing contact with pin 70. The open car mode 44 is then selected for the amplifier 76 when applying its signals to the speakers 16–22. When the automobile 10 is open with the top 12 lowered and the system 50 is in the open car mode 44 for the equalizer 26 and it is desired to close the car by raising the top, the pushbutton portion 51 of the rocker switch 40 is pressed. This applies a signal over line 80 through a second RC timing circuit 82 which energizes the relay 58 to switch from the FIG. 4 to the FIG. 3 position, thus opening contact with pin 70 (FIG. 4) and closing contact with pin 66 (FIG. 3). As the convertible top 12 closes, equalizer 26 then applies the closed car mode 43 through line 74 to the amplifier 76. The RC elapsed timers 56 and 82 provide a sufficient time delay so that equalization is not shifted from one mode 43 or 44 to the other mode 43 or 44 unless the operator actually intends to raise or lower the convertible top 12. If one of the buttons 51 or 52 of the rocker switch 40 is unintentionally pressed and then released before the expiration of the three second time interval, the relay 58 is not tripped and equalization remains as is.

Figure 5:
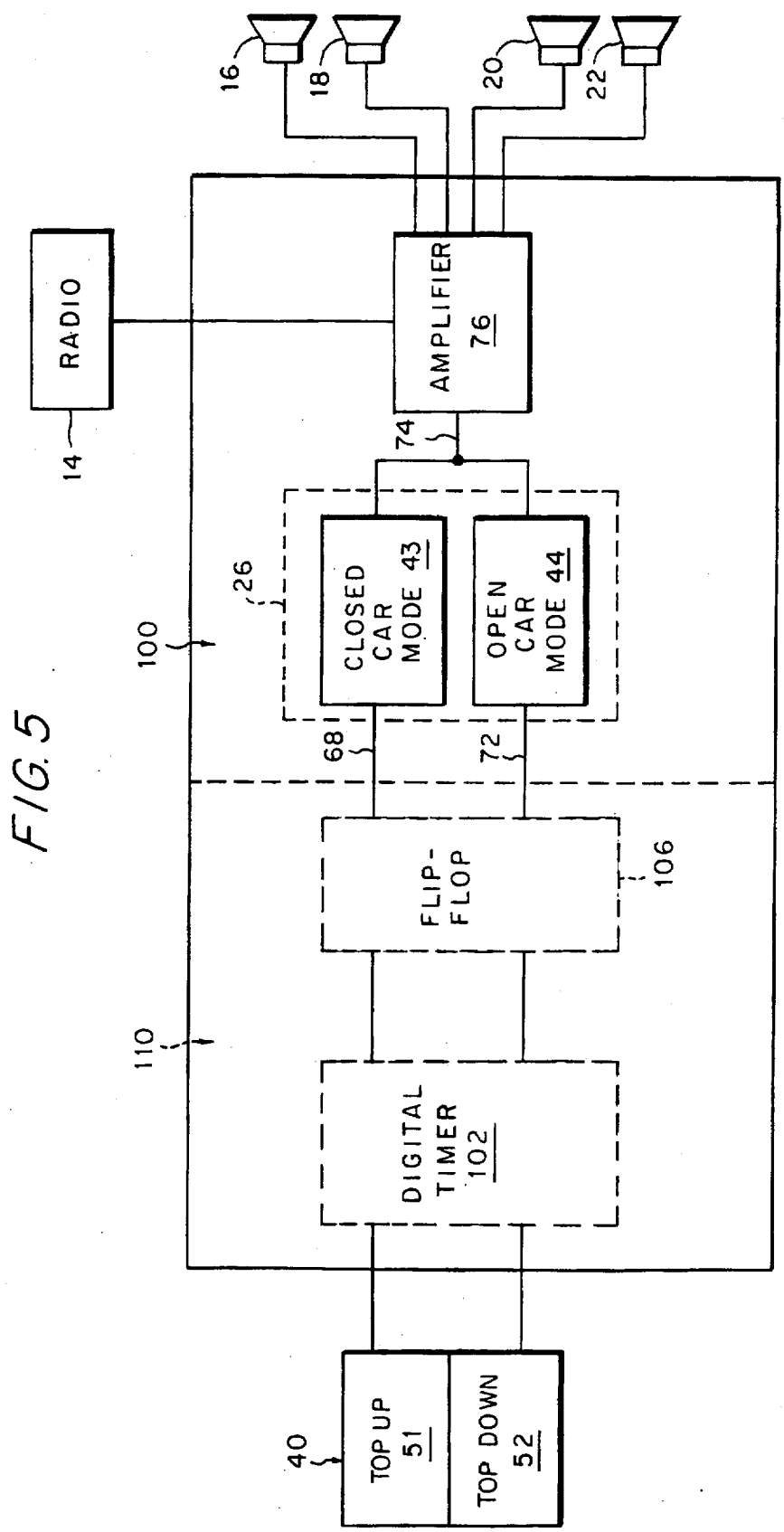
FIG. 5 is a diagram showing a second embodiment of an equalization system according to the present invention.

Referring now to FIG. 5, where a second embodiment 100 of the system in accordance with the present invention is illustrated, it is seen that the system 100 has a different configuration wherein a digital timing circuit 102 of a conventional configuration is connected to a conventional flip-flop circuit 106 which selects between the line 68 for the closed car mode 43 and the line 72 for the open car mode 44. The conventional digital timing circuit 102 is configured to reset to "0" if the pushbutton portions 51 or 52 being pressed is released before expiration of the preselected three second time interval.

Figure 6:
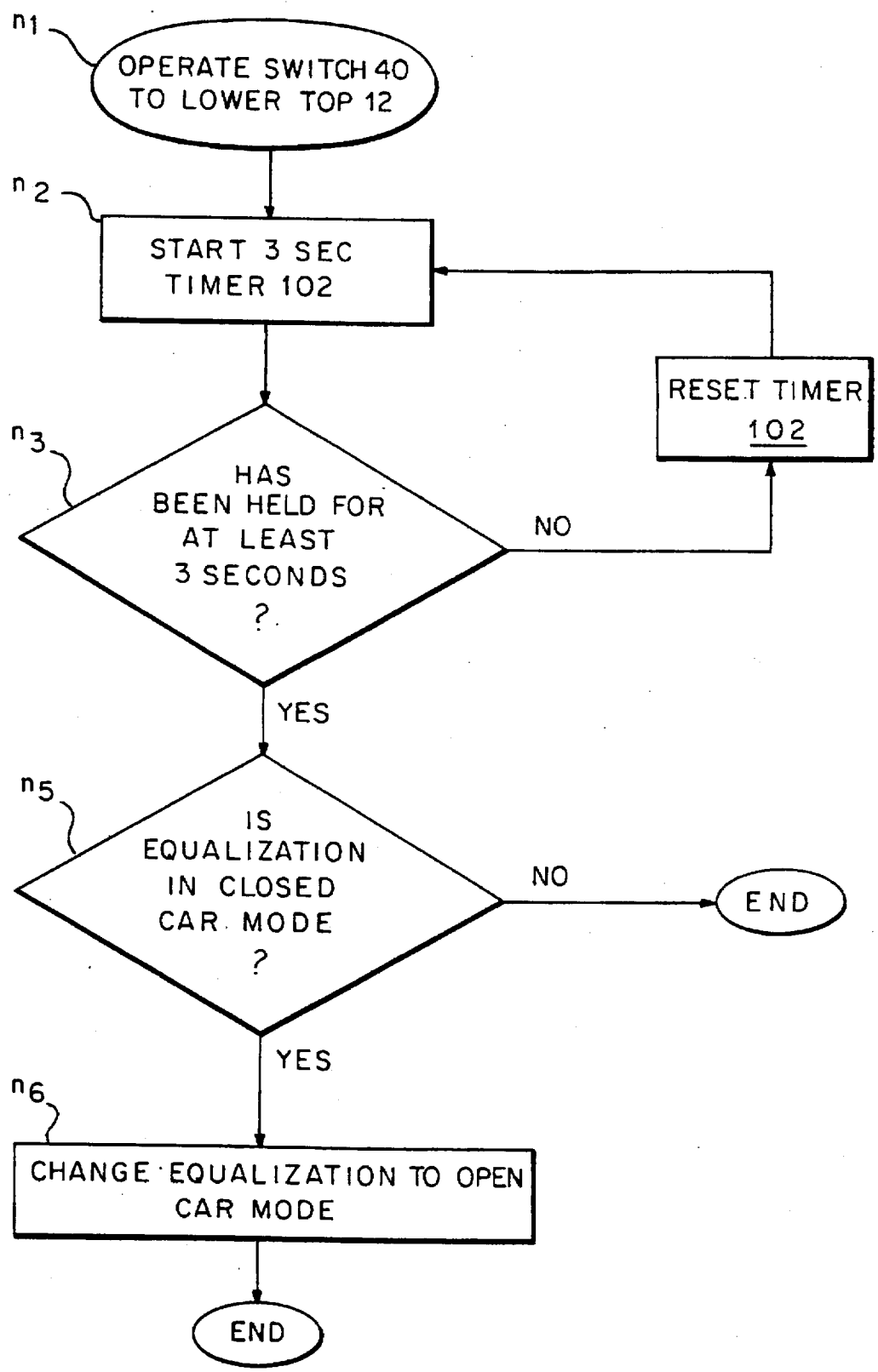
FIG. 6 is a flow chart illustrating operation of the equalization arrangement when the top is to be lowered.
Figure 7:
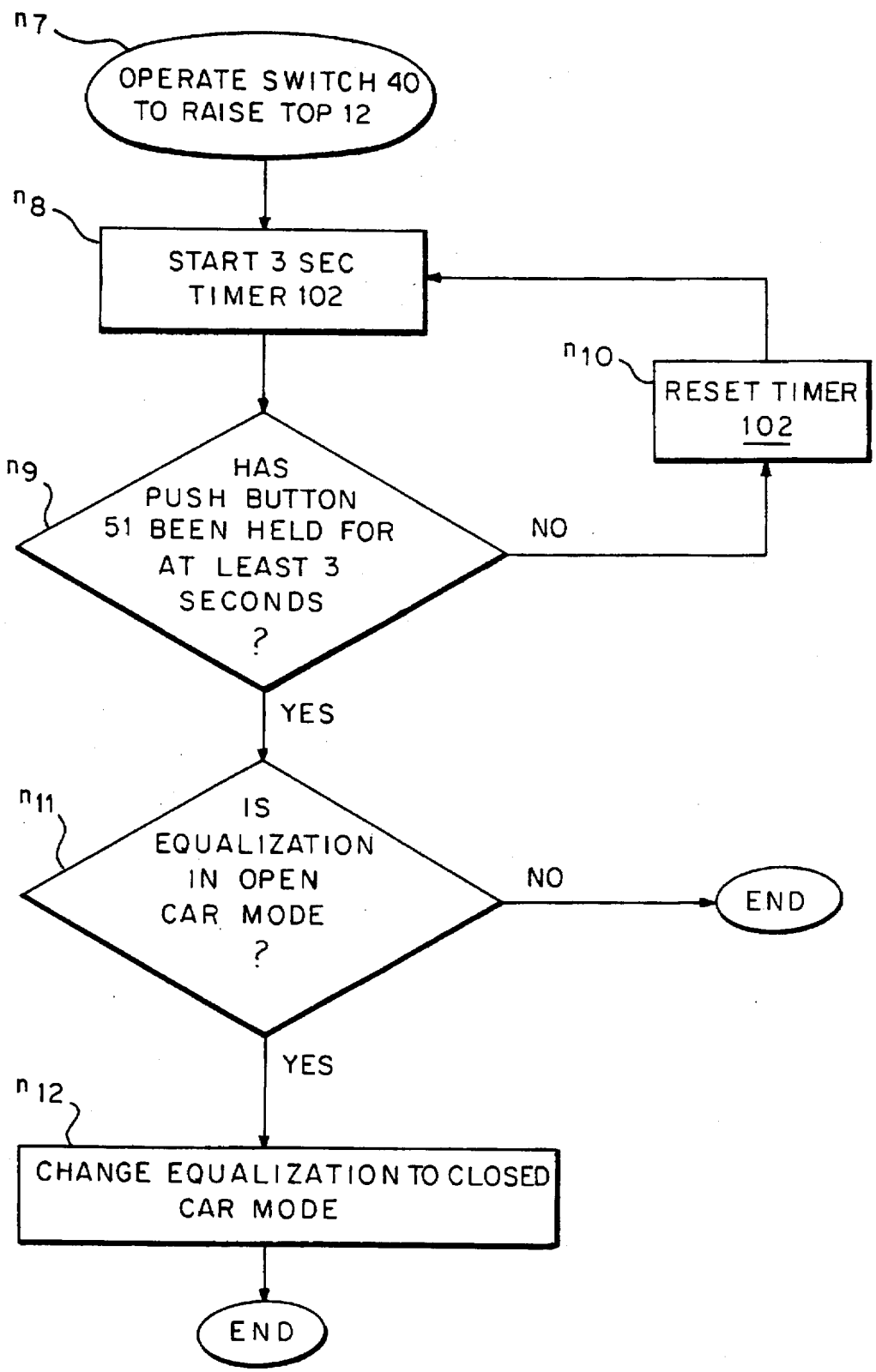
FIG. 7 is a flow chart illustrating operation of the equalization arrangement when the top is being raised.

With the arrangement of FIG. 5, the timing circuits 102 and the flip-flop 106 can optionally be circuits already incorporated in the architecture of the body computer 110 of automobile 10 which circuits are programmed to function in accordance with the flow charts of FIGS. 6 and 7. In this way, the present invention may be incorporated into existing vehicle designs with minimal hardware costs. The body computer 110 is programmed, using conventional techniques to perform the steps of FIGS. 6 and 7 wherein, in order to lower the convertible top 12, steps $n_1$ through $n_6$ are performed, and, in order to raise the convertible top 12, steps $n_7$–$n_{12}$ are performed.

Using the body computer 110 of FIG. 5, in step $n_1$, the button 52 of the switch 40 is pressed to lower the convertible top 12 in order to start timer 102 in step $n_2$. After the timer 102 has timed out a three second time interval, it is determined whether the pushbutton 52 has been held for at least three seconds in step $n_3$. In step $n_4$, if the pushbutton 52 has not been held for at least three seconds the timer 102 is reset to "0". In step $n_5$, it is determined whether or not the equalization is in the closed car mode 43 and, if it is not, the sequence stops. If the equalization is in the closed car mode 43, then in step $n_6$, the equalization is changed to the open car mode 44.

Referring now to FIG. 7, when the convertible top 12 is lowered and the equalization is in the open car mode 44, in the initial step $n_7$, pushbutton 51 of rocker switch 40 is pushed to start the three second timer 104 for step $n_8$. In step $n_9$, it is determined whether or not pushbutton 51 has been held for at least three seconds and, if not, the timer 102 is reset in step $n_{10}$. If the pushbutton has been held for at least three seconds, it is determined in step $n_{11}$ if the equalizer is in the open car mode 44 and, if this is the case, then the sequence stops. If the equalizer 26 is in the open car mode 44, then, in step $n_{12}$, the equalizer 26 is changed to the closed car mode 43.

System 50 also will correct itself if the equalization becomes incorrectly set. This can occur if an operator operates the rocker switch 40 in several discreet increments, each sufficiently short to not trigger the alternate equalization switching circuit. Another situation is when the vehicle battery is replaced or run down or if the amplifier is serviced.

If the equalization becomes reversed due to ny of the above situations, the equalization will correct itself the first time the top is cycled in one direction (the amplifier will remain in the same equalization mode during the cycle).

In addition for service, the amplifier is set to a default equalization for a TOP-UP (car closed) condition.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A method of controlling speaker equalization in an automotive vehicle having a convertible top and an audio system, wherein the audio system includes equalizing circuitry for selecting treble and bass tones and fade and balance settings for speakers in the automotive vehicle, wherein the vehicle includes a motor for lowering the convertible top when rotated in a first direction and raising the convertible top when rotated in a second direction, the motor being controlled by a switch which has three switch positions wherein a first switch position energizes the motor to lower the convertible top, a second switch position energizes the motor to raise the convertible top and a third switch position does not energize the motor, the method comprising the steps of:

upon moving the switch to the first position to lower the convertible top and holding the switch in the first position for a preselected time interval, switching the equalization circuitry to a preselected open car equalization mode with first treble and bass tones and a first fade and balance setting; and upon moving the switch to the second position to raise the convertible top and upon holding the switch in the second position for the preselected time interval, switching the equalization circuitry to the preselected closed car equalization mode with second treble and bass tones and a second fade and balance setting.

2. The method of claim 1, wherein the preselected time interval is about three seconds.

3. In an automotive vehicle having a convertible top and an audio system with equalizing circuitry for selecting treble and bass tones and fade and balance settings for speakers in the automotive vehicle, the vehicle including a motor for lowering the convertible top when rotated in a first direction and raising the convertible top when rotated in a second direction, the motor being controlled by a switch which has three switch positions wherein a first switch position energizes the motor to lower the convertible top, a second switch position energizes the motor to raise the convertible top and a third switch position does not energize the motor, the improvement comprising:

a preselected closed car equalization mode for equalizing the audio system when the convertible top is raised;

a preselected open car equalization mode for equalizing the audio system when the convertible top is down;

an elapsed time timer for determining a preselected time interval;

a connection for connecting the timer to the switch positions wherein, when the first position or the second position is selected, the timer provides an output upon expiration of the selected time interval;

a switching circuit connected to the timer, the switching circuit having a first mode in which the preselected open car equalization mode is selected and a second mode in which the preselected closed car equalization circuit is selected;

an amplifier connected between the preselected open car and preselected closed car equalization circuits and the speakers, wherein upon selecting the first switch position, the open car equalization circuit is energized and the closed car equalization circuit is de-energized after expiration of the preselected time interval and wherein, when the second switch position is selected, the closed car equalization circuit is energized and the open car equalization circuit is de-energized after expiration of the preselected time interval.

4. The improvement of claim 3, wherein the timing circuit is an R-C circuit.

5. The improvement of claim 4, wherein the switching circuit is an electromechanical relay.

6. The improvement of claim 3, wherein the timing circuit is a flip-flop.

7. The improvement of claim 6, wherein the switching circuit is a solid state switching circuit.

8. The improvement of claim 3, wherein the three switch positions are embodied in a single rocker switch.

* * * * *